(12) United States Patent
Alderton

(10) Patent No.: US 6,567,479 B1
(45) Date of Patent: May 20, 2003

(54) SYSTEM AND METHOD FOR EXTRACTING AND COMPENSATING FOR REFERENCE FREQUENCY ERROR IN A COMMUNICATIONS SYSTEM

(75) Inventor: Martin Alderton, San Diego, CA (US)

(73) Assignee: Uniden Financial, Inc., Ft. Worth, TX (US)

( * ) Notice: Subject to any disclaimer, the term of this patent is extended or adjusted under 35 U.S.C. 154(b) by 0 days.

(21) Appl. No.: 09/063,944

(22) Filed: Apr. 21, 1998

(51) Int. Cl.[7] .............................. H04L 26/16; H03D 3/24
(52) U.S. Cl. ........................ 375/326; 375/376; 375/327
(58) Field of Search ................................. 375/326, 327, 375/373, 376; 329/302, 307, 309, 303, 304, 305, 306, 308

(56) References Cited

U.S. PATENT DOCUMENTS

| | | | | |
|---|---|---|---|---|
| 4,169,246 A | * | 9/1979 | Schriber et al. | 375/326 |
| 4,599,732 A | * | 7/1986 | LeFever | 375/232 |
| 4,764,730 A | * | 8/1988 | Miyo et al. | 329/307 |
| 4,958,360 A | * | 9/1990 | Sari | 375/376 |
| 5,079,512 A | * | 1/1992 | Muto | 329/308 |
| 5,170,415 A | * | 12/1992 | Yoshida et al. | 375/326 |
| 5,376,894 A | * | 12/1994 | Petranovich | 329/306 |
| 5,425,057 A | * | 6/1995 | Paff | 375/326 |
| 5,490,176 A | * | 2/1996 | Peltier | 375/327 |
| 5,933,460 A | * | 8/1999 | Lee | 375/326 |
| 5,987,078 A | * | 11/1999 | Kiyanagi et al. | 375/326 |

FOREIGN PATENT DOCUMENTS

JP    05048393    * 2/1993

* cited by examiner

Primary Examiner—Tesfaldet Bocure
(74) Attorney, Agent, or Firm—Cooley Godward LLP

(57) ABSTRACT

A system for extracting and compensating for reference frequency error adapted for use with a communication system. The system includes a frequency generator for outputting a reference signal of a first frequency. The frequency generator has a control input for adjusting the first frequency in response to a control signal. A receive circuit receives an input signal and provides an output signal having a first and second component in response thereto. An error extraction circuit provides an error value based on a phase difference between the first component and the second component, and provides the control signal in response thereto. The error extraction circuit preferably includes a positive error counting circuit for generating a positive count when the first component lags the second component and a negative error counting circuit for generating a negative count when the first component leads the second component. A frequency error control circuit generates the control signal from the difference of the positive count and the negative counts.

30 Claims, 6 Drawing Sheets

SYSTEM AND METHOD FOR EXTRACTING AND COMPENSATING FOR REFERENCE FREQUENCY ERROR IN A COMMUNICATIONS SYSTEM

BACKGROUND OF THE INVENTION

1. Field of Invention

This invention relates to communications systems. Specifically, the present invention relates systems for measuring and correcting error in reference frequency sources in cellular telecommunications systems.

2. Description of the Related Art

Cellular telecommunications systems are characterized by a plurality of mobile transceivers in communication with one or more base stations. Each transceiver includes a transmitter and a receiver. The receiver must often translate signals within a certain range of frequencies to a different range or band of frequencies. The accuracy of the frequency translation is affected by the accuracy of a periodic reference signal used in the translation. For example, in a code division multiple access (CDMA) cellular telephone network, a local oscillator in a mobile receiver provides a periodic signal that facilitates the translation of incoming radio frequency (RF) signals to an intermediate frequency (IF) band. If the frequency of the local oscillator is inaccurate, the translated signals may be translated outside of the desired IF band.

Digital telecommunications systems may employ one of several methods to demodulate a digitally modulated waveform. Such methods include binary-phase-shift-keying (BPSK), quadrature-phase-shift-keying (QPSK), offset QPSK (OQPSK), m-ary phase-shift-keying (MPSK), or quadrature amplitude modulation (QAM). It is often necessary for the system to lock to a received RF signal. The ability of the modulator to lock on the signal, and therefore its performance as indicated by the degradation in the measured bit error rate (BER) versus the theoretical BER, is influenced by the phase noise of the generated periodic reference signals.

Voltage-controlled temperature-compensated crystal oscillators (VC-TCXOs) often generate the periodic reference signals. A VC-TCXO has a control input used to adjust the frequency of the VC-TCXO in response to a high BER.

To measure the BER, a digital zero-crossing counter circuit is often used to perform error calculations on an IF output from the receiver. However, the counter circuit requires that the IF output signal drive digital circuitry in the zero-crossing circuit. This represents an inconvenience that increases system design time and expense. In addition, processing of high frequency IF signals requires fast digital circuitry that consumes excess power.

Alternatively, a digital signal processor calculates an error metric from digital baseband signals in the receiver. This system however, typically has limited accuracy and lock-in range.

Hence, a need exists in the art for an accurate, power-efficient system for measuring errors due to inaccurate reference frequencies. There is a further need for a system to compensate for the errors, the system having excellent error measurement accuracy and lock-in range.

SUMMARY OF THE INVENTION

The need in the art is addressed by the system for extracting and compensating for reference frequency error of the present invention. In the illustrative embodiment, the inventive system is adapted for use with a communications system and includes a frequency generator for outputting a reference signal of a first frequency. The frequency generator has a control input for adjusting the first frequency in response to a control signal. A receive circuit receives an input signal and provides an output signal having a first and second component in response thereto. An error extraction circuit provides an error value based on a phase difference between the first component and the second component, and provides the control signal in response thereto.

In a specific embodiment the frequency generator includes a voltage-controlled oscillator. The receive circuit is a telecommunications receiver that includes a vector demodulator. The vector demodulator produces in-phase and quadrature signals from the input signal. The in-phase and quadrature signals correspond to the first and second signal components, respectively. The error extraction circuit includes a positive error counting circuit for generating a positive count when the first component lags the second component. The error extraction circuit further includes a negative error counting circuit that generates a negative count when the first component leads the second component. The positive error counting circuit and the negative error counting circuit include first and second edge-triggered J-K flip-flops, respectively. A J-input of the second J-K flip-flop is connected in parallel to a clock input of the first J-K flip-flop, and a J-input of the first J-K flip-flop is connected to a clock input of the second J-K flip-flop. A K-input of the first J-K flip-flop and a K-input of the second J-K flip-flop are tied high.

In the illustrative embodiment, the error extraction circuit further includes an accumulation circuit for providing a difference of the positive count and the negative counts. The accumulation circuit includes an up-counter having an input connected to a Q-output of the first J-K flip-flop, and a down-counter having an input connected to a Q-output of the second J-K flip-flop. The accumulation circuit further includes a subtractor having an input connected, in parallel, to the output of the up-counter and the output of the down-counter. A frequency error control circuit generates the control signal from the difference of the positive count and the negative counts. The magnitude of the control signal is dependent on parameters of the frequency generator.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant-utility.

The following review of the operation of a traditional telecommunications receiver is intended to facilitate an understanding of the present invention.

Figure 1:
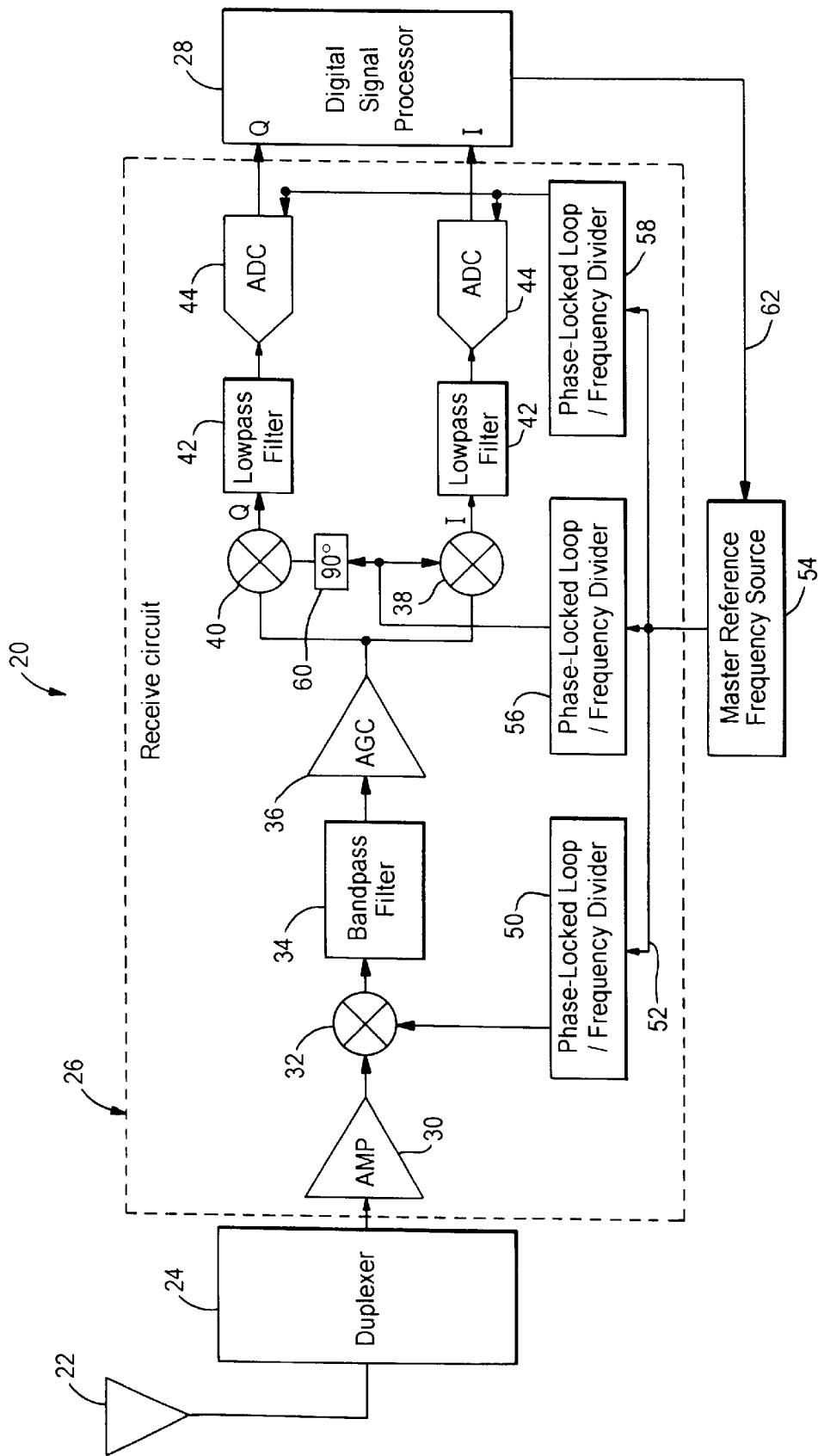
FIG. 1 is a block diagram of a conventional telecommunications receiver having a master reference frequency source for providing a reference frequency.

FIG. 1 is a block diagram of a conventional telecommunications receiver 20. The receiver 20 includes, from left to right, an antenna 22, a duplexer 24, a receive circuit 26, and a digital signal processor 28. A front end of the receive circuit 26 includes, from left to right, an amplifier 30, a radio frequency (RF)-to-intermediate frequency (IF) mixer 32, a bandpass filter 34, and an automatic gain control circuit (AGC) 36. The output of the AGC 36 is connected to a vector demodulator of the receive circuit that includes, from left to right, first 38 and second 40 IF-to-baseband mixers, lowpass filters 42, and analog-to-digital converters (ADCs) 44.

In operation, the antenna 22 receives a transmitted RF signal that is routed through the duplexer 24 and then input to the receive circuit 26. In the receive circuit 26, the received RF signal is amplified by the amplifier 30 and then converted to an IF signal via the RF-to-IF mixer 32. The resulting IF signal is filtered by the bandpass filter 34 and output to the AGC 36 where the gain of the signal is adjusted and input, in parallel, to the IF-to-baseband mixers 38, 40. The first 38 and second 40 IF-to-baseband mixers output in-phase (I) and quadrature (Q) signal components of the IF signal, respectively. The I and Q signals are then filtered by the lowpass filters 42 and converted to digital signals 50 via the ADCs 44.

The RF-to-IF mixer 32, the IF-to-baseband mixers 38 and 40, and the ADCs 44 all require a frequency reference input to successfully perform their tasks, allowing the receiver 20 to lock on to a received signal and perform the necessary frequency conversions. A first local oscillator, i.e., phase-locked loop/frequency divider (PLL) 50 supplies the RF-to-IF mixer 32 with a reference frequency by phase-locking the output of the PLL 32 to a predetermined multiple of the frequency of a master reference signal 52 from a master reference frequency source 54. Similarly, second 56 and third 58 PLLs supply the IF-to-baseband mixers 38, 40 and the ADCs 44 with reference frequencies derived from the master reference signal 52, respectively. A ninety degree phase shifter 60 shifts the phase of the reference frequency output of the second PLL 56 by ninety degrees for use by the second IF-to-baseband mixer 40.

The master reference frequency source 54 is typically a voltage-controlled temperature-compensated crystal oscillator (VC-TCXO). The frequency of the master reference signal 52 is adjustable via a frequency control signal 62 from the DSP 28 in response to signal reception errors detected by the DSP 28.

Figure 2:
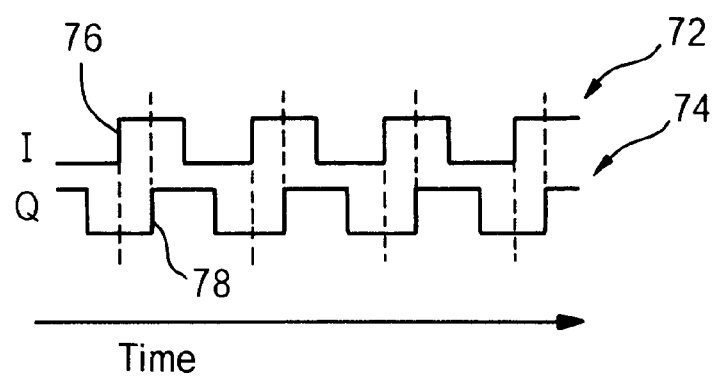
FIG. 2 is a diagram showing in-phase and quadrature signals output from a comparator and provided via the receiver of FIG. 1 when the reference frequency has a negative error.

FIG. 2 is a diagram showing digital in-phase (I) 72 and quadrature phase (Q) 74 signals output from a comparator (as discussed more fully below) and provided via the receive circuit 26 of FIG. 1 when the reference frequency provided by the master reference frequency source 54 of FIG. 1 has a negative error. The I and Q signals 72 and 74, respectively, have been converted to digital signals suitable for interfacing to digital logic circuits. The I and Q signals 72 and 74, respectively, have the phase relationship of the original baseband I and Q signals. The I signal 72 leads the Q signal 74 as is illustrated by the fact that a first rising edge 76 of the I signal 72 occurs just before a first rising edge 78 of the Q signal 74.

Figure 3:
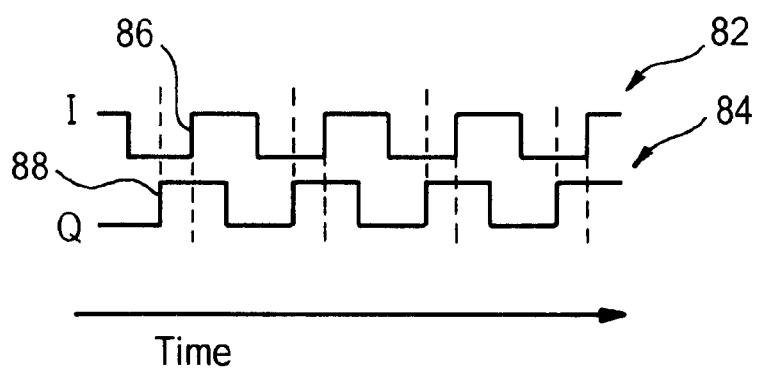
FIG. 3 is a diagram showing in-phase and quadrature signals output from a comparator and provided via the receiver of FIG. 1 when the reference frequency has a positive error.

FIG. 3 is a diagram showing digital I 82 and Q signals 84 output from a comparator (as discussed more fully below) and provided via the receive circuit 26 of FIG. 1 when the reference frequency provided by the master reference frequency source 54 of FIG. 1 has a positive error. The I 82 and Q 84 signals have been converted to digital signals suitable for interfacing to digital logic circuits. The I and Q signals 82 and 84, respectively, have the phase relationship of the original baseband I and Q signals. The I signal 82 lags the Q signal 84 as is illustrated by the fact that a first rising edge 86 of the I signal 82 occurs just after a first rising edge 88 of the Q signal 84.

Figure 4:
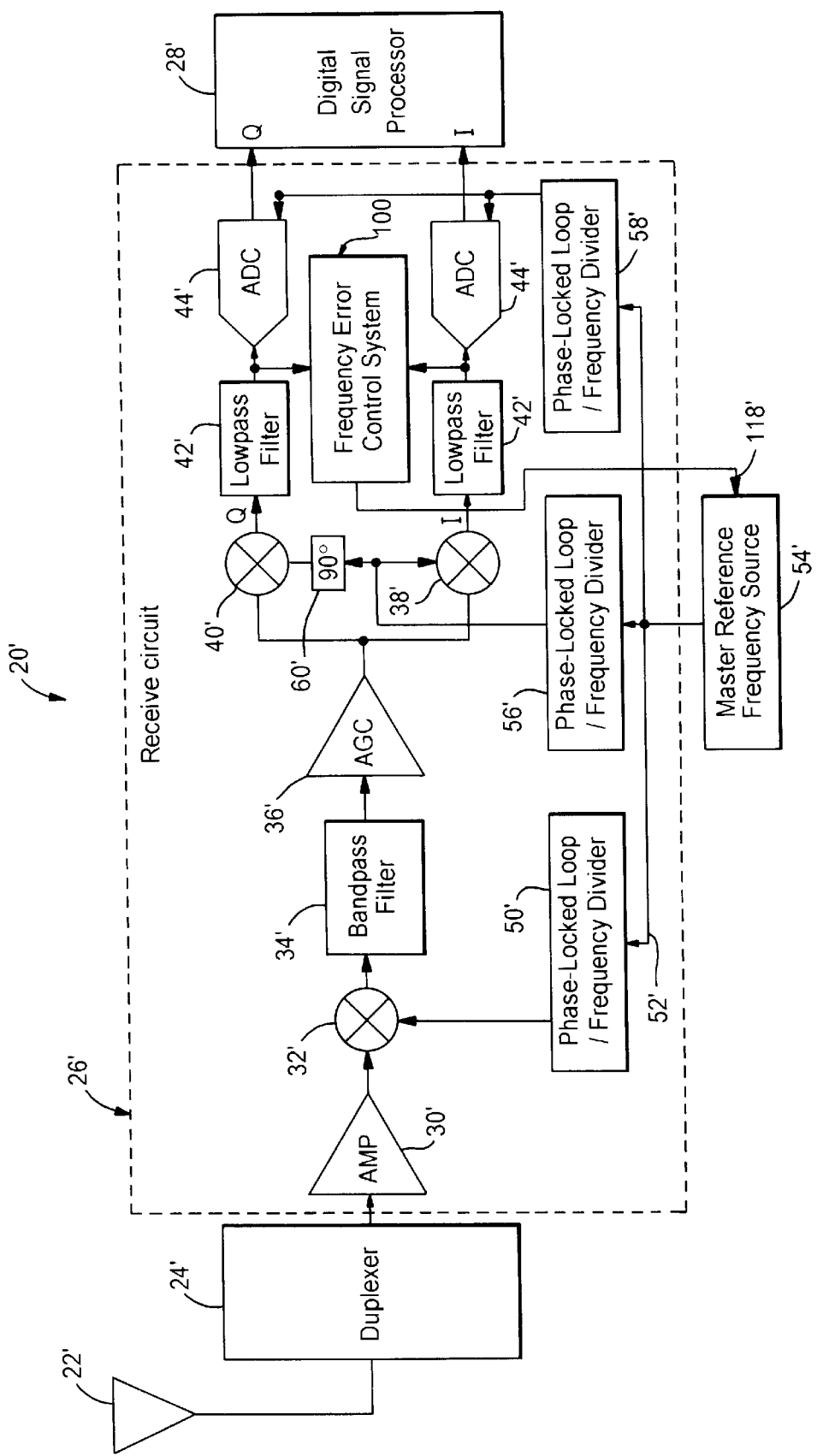
FIG. 4 is a block diagram showing the system for extracting and compensating for reference frequency error of the present invention implemented in the receiver of FIG. 1.

FIG. 4 is a block diagram showing the frequency error control system 100 for extracting and compensating for reference frequency error of the present invention implemented in a receiver 20'.

The receiver 20' includes, from left to right, an antenna 22', a duplexer 24', a receive circuit 26', and a digital signal processor 28'. A front end of the receive circuit 26' includes, from left to right, an amplifier 30', a radio frequency (RF)-to-intermediate frequency (IF) mixer 32', a bandpass filter 34', and an automatic gain control circuit (AGC) 36'. The output of the AGC 36' is connected to a vector demodulator of the receive circuit that includes, from left to right, first 38' and second 40' IF-to-baseband mixers, lowpass filters 42', and analog-to-digital converters (ADCs) 44'.

In operation, the antenna 22' receives a transmitted RF signal that is routed through the duplexer 24' and then input to the receive circuit 26'. In the receive circuit 26', the received RF signal is amplified by the amplifier 30' and then converted to an IF signal via the RF-to-IF mixer 32'. The resulting IF signal is filtered by the bandpass filter 34' and output to the AGC 36' where the gain of the signal is adjusted and input, in parallel, to the IF-to-baseband mixers 38', 40'. The first 38' and second 40' IF-to-baseband mixers output in-phase (I) and quadrature (Q) signal components of the IF signal, respectively. The I and Q signals are then filtered by the lowpass filters 42' and converted to digital signals 50' via the ADCs 44'.

The RF-to-IF mixer 32', the IF-to-baseband mixers 38' and 40', and the ADCs 44' all require a frequency reference input to successfully perform their tasks, allowing the receiver 20' to lock on to a received signal and perform the necessary frequency conversions. A first local oscillator, i.e., phase-locked loop/frequency divider (PLL) 50' supplies the RF-to-IF mixer 32' with a reference frequency by phase-locking the output of the PLL 32' to a predetermined multiple of the frequency of a master reference signal 52' from a master reference frequency source 54'. Similarly, second 56' and third 58' PLLs supply the IF-to-baseband mixers 38', 40' and the ADCs 44' with reference frequencies derived from the master reference signal 52', respectively. A ninety degree phase shifter 60' shifts the phase of the reference frequency output of the second PLL 56' by ninety degrees for use by the second IF-to-baseband mixer 40'.

The master reference frequency source 54' is a voltage-controlled temperature-compensated crystal oscillator (VC-TCXO). The frequency of the master reference signal 52' is adjustable via a frequency control signal 118 from the DSP 28' in response to signal reception errors detected by the system 100.

The system 100 receives I and Q-inputs from the low pass filters 42' corresponding to the outputs of the first mixer 38' and the second mixer 40', respectively. The system 100 extracts an error value based on a cumulative phase difference between the inputs and then outputs the reference frequency control signal 118' to correct the frequency of the master reference frequency source 54' in response to the error value.

Those skilled in the art will appreciate that the system 100' may be implemented in the digital signal processor 28' without departing from the scope of the present invention.

Figure 5:
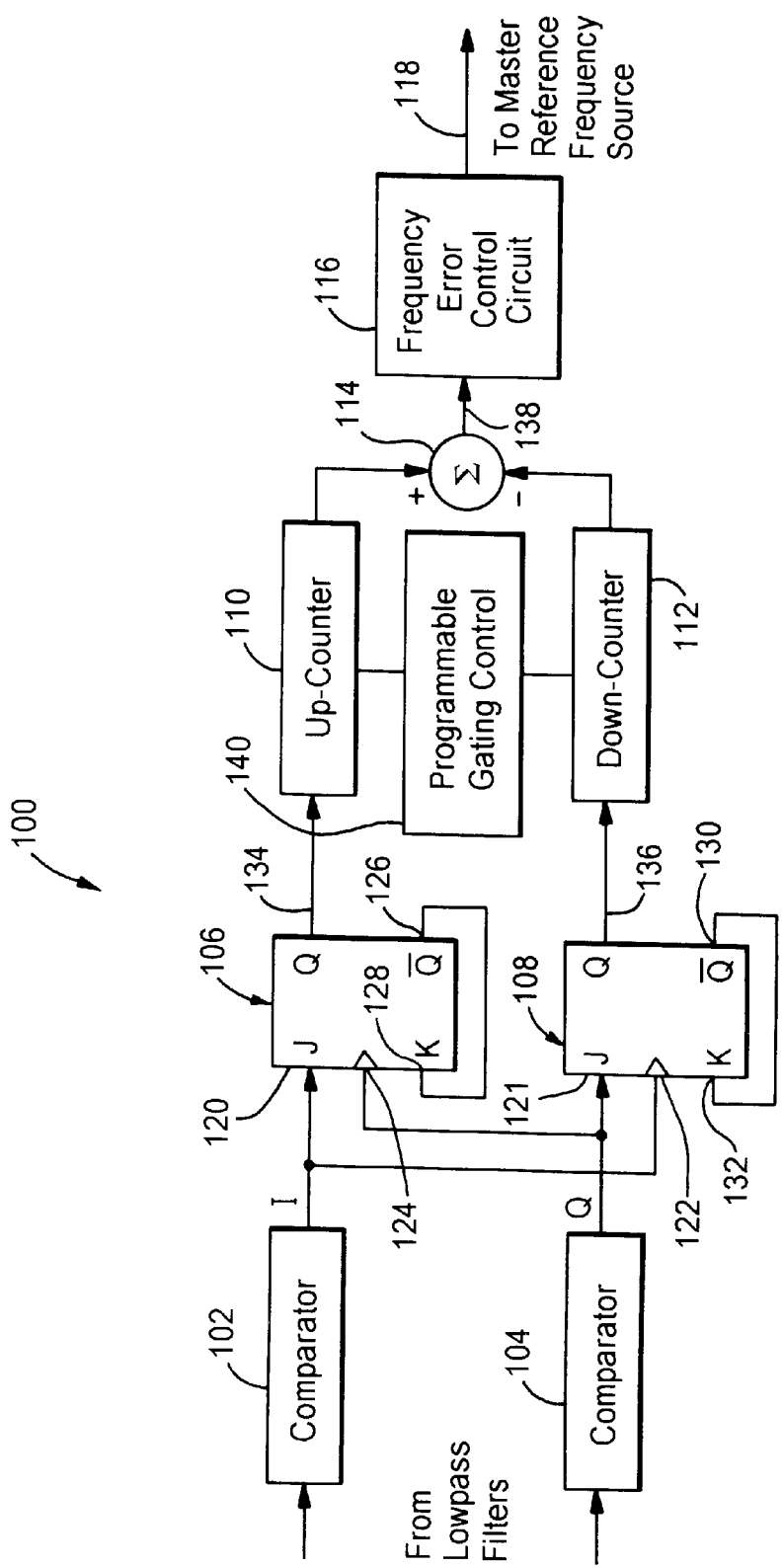
FIG. 5 is block diagram of the system for extracting and compensating for reference frequency error of FIG. 4.

FIG. 5 is block diagram of the system 100 for extracting and compensating for reference frequency error of FIG. 4. The system 100 includes a first analog-to-digital converter (ADC) 102 and a second ADC 104 connected to a first edge-triggered J-K flip-flop 106 and a second edge-triggered J-K flip-flop 108. The outputs of the first 106 and second 108 J-K flip-flops are connected to an up-counter 110 and a down-counter 112, respectively. The outputs from the counters 110 and 112 are connected to the inputs of a subtractor 114 whose output is connected to the input of a frequency error control circuit 116 that outputs the reference frequency control signal 118.

In operation, the first ADC 102 receives the analog I-signal output of the first mixer 38 of FIG. 1 after filtering by the lowpass filter 42 of FIG. 1. The first ADC 102 converts the analog I-signal to a digital signal suitable for driving digital circuitry such as the J-K flip-flops 106 and 108. The first ADC 102 is implemented with a bistable comparator that compares the input analog I-signal to a threshold thereby quantizing the value into a high voltage state or a low voltage state depending on the result of the comparison. Those skilled in the art will appreciate that the ADC 102 may be implemented with a different type of analog-to-digital converter without departing from the scope of the present invention.

Similarly, the second ADC 104 receives the analog Q-signal output of the second mixer 40 of FIG. 1 after filtering by the lowpass filter 42 of FIG. 1. The second ADC 104 converts the analog Q-signal to a digital signal suitable for driving digital circuitry such as the J-K flip-flops 106 and 108. The second ADC 104 is implemented with a bistable comparator that compares the input analog Q-signal to a threshold thereby quantizing the value into a high voltage state or a low voltage state depending on the result of the comparison. Those skilled in the art will appreciate that the ADC 104 may be implemented with a different type of analog-to-digital converter without departing from the scope of the present invention.

The digital I-signal output from the ADC 102 is connected, in parallel, to a J-input 120 of the first J-K flip-flop, and to a clock input 122 of the second J-K flip-flop 108. The digital Q-signal output from the second ADC 104 is connected, in parallel, to a J-input 121 of the second J-K flip-flop 108 and to a clock input 124 of the first J-K flip-flop 106. A K-input 128 of the first J-K flip-flop 106 and a K-input 132 of the second J-K flip-flop 108 are connected to a high voltage source ($V_{cc}$) such as five volts, i.e., are tied high. The complimentary outputs 126 and 130 remain unconnected, i.e., as open circuits, while the K-inputs 128 and 132 remain connected to the high voltage source (see FIG. 7). An up-count Q-output 134 of the first J-K flip-flop 134 is connected to the input of the up-counter 110 and a down-count Q-output 136 of the second J-K flip-flop 108 is connected to the input of the down-counter 112.

The novel design of the present invention is facilitated by the fact that when I signal lags the Q signal, a positive reference frequency error is indicated. Similarly, a negative frequency error in the reference frequency signal causes the I-signal to lead the Q-signal.

In the following discussion, the term previous state refers to the state of the J-input of a J-K flip-flop before the J-K flip-flop is clocked by a signal to its clock input. The transition function of the J-K flip-flops 106 and 108 is illustrated in the following table where a 0 corresponds to a low state, and a 1 corresponds to a high state.

TABLE I

| Previous State: | Inputs J(t) K(t) | | | |
|---|---|---|---|---|
| | 0 0 | 0 1 | 1 0 | 1 1 |
| 0 | 0 | 0 | 1 | 1 |
| 1 | 1 | 0 | 1 | 0 |
| No State (NS) | NS | NS | NS | NS |

The table illustrates that, for example, in the last column, when the J and K inputs of the J-K flip-flops 106 or 108 are high (1 1), and the previous state of the Q-output was low (0), the Q-output will toggle to high (1). Note that only the second (0 1) and third (1 1) columns of data are applicable to the J-K flip-flops 106 and 108 because the K-inputs 128 and 132, respectively, remain high.

The J-K flip-flops 106 and 108 are rising-edge triggered flip-flops, meaning that the flip-flops 106 and 108 are clocked when their clock inputs 124 and 122, respectively, transition from low to high.

With reference to FIG. 2, when the I-signal 72 leads the Q-signal 74, the first rising-edge 76 of the I-signal 72 clocks the second J-K flip-flop 108. The down-count output 136 of the J-K flip-flop 108 transitions to a high state in response to the low state of the Q-signal 74 (see the last column (1 1) in Table 1). The high state of the down-count output 136 triggers the down-counter 112, which increments a negative error count in response to the high state. Simultaneously, the up-count output 134 of the first J-K flip-flop 106 remains low (see the second column of data (0 1) in Table 1). Hence, when the I-signal 72 leads the Q-signal 74, the up-count output 134 remains low while down-count output 136 toggles.

With reference to FIG. 3, when the I-signal 82 lags the Q-signal 84, the first rising-edge 88 of the Q-signal 82 clocks the first J-K flip-flop 106. The up-count output 134 of the first J-K flip-flop 106 transitions to a high state in response to the previous low state of the I-signal 82 (see the last column (1 1) in Table 1). The high state of the up-count output 134 triggers the up-counter 110, which increments a positive error count in response to the high state. Simultaneously, the down-count output 136 of the second J-K flip-flop 108 remains low (see the second column of data (0 1) in Table 1). Hence, when the I-signal 82 lags the Q-signal 84, the up-count output 134 toggles while down-count output 136 remains low.

The up-counter 110 and the down-counter 112 accumulate totals of the instances of positive reference frequency error and the instances of negative reference frequency error, respectively. These totals are output to the subtractor 114. The subtractor 114 takes a difference between the totals to obtain a signal representation 138 of the direction of and the amount of error in the reference frequency. This error signal 138 is output to the frequency control circuit 116 where the signal 138 is adjusted to provide the control signal 118. The required adjustments to the error signal 138 vary depending on the type of master reference frequency source (see 54 of FIG. 1) used and may include signal gain adjustments. The control signal 118 is provided to the master reference frequency source 54 of FIG. 1 where it corrects the output reference frequency in response to the magnitude of the error signal 138.

The up-counter 110 and the down-counter 112 are periodically activated by a programmable gating control circuit, 140. The gating control circuit 140 controls the period of activation, i.e., gating period ($T_{gate}$) of the counters 110 and 112. At the end of a predetermined gating time interval, the up-counts and down-counts of the up-counter 110 and the down-counter 112, respectively, are re-set to zero via the programmable gating control circuit 140. The gating control circuit 140 is easily implemented with a programmable timer that periodically issues a clear signal for a predetermined duration to the counters 110 at a programmed time interval. The predetermined duration and the time interval, i.e, $T_{gate}$, are dependent upon the application in which the system 100 is used.

The construction of the individual ADCs 102 and 104, J-K flip-flops 106 and 108, counters 110 and 112, and error control circuit 116 are well known in the art. ←

Figure 6:
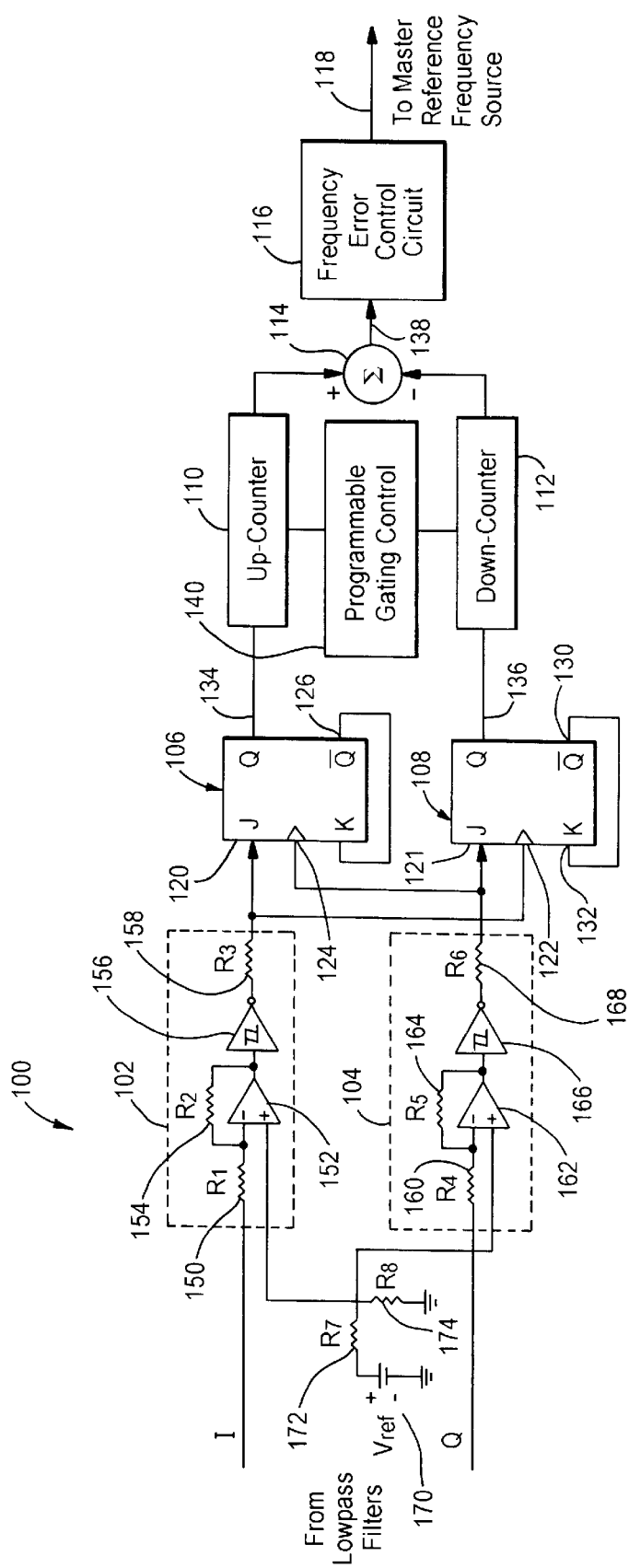
FIG. 6 is a more detailed diagram of the system of FIG. 5.

FIG. 6 is a more detailed diagram of the system 100 of FIG. 5. In the present specific embodiment, the first ADC 102 is implemented as a comparator circuit employing a first Schmitt trigger 156. The first Schmitt trigger 156 is accompanied by a gain circuit having a first resistor ($R_1$) 150 with one end connected to the analog input I-signal and the opposite end connected to the negative terminal of a first operational amplifier 152. The negative terminal of the first operational amplifier 152 is connected to one end of a second resistor ($R_2$) 154. The opposite end of the second resistor 154 is connected to the output of the operational amplifier 152. The output of the operational amplifier 152 is fed to the Schmitt trigger 156 and then input one end of a third resistor ($R_3$) 158. The opposite end of the third resistor 158 provides a digital I-output signal as the output of the first ADC 102.

Similarly, the second ADC 104 is implemented as a comparator circuit employing a second Schmitt trigger 166. The Schmitt trigger 166 is preceded by a gain circuit having a fourth resistor ($R_4$) 160 with one end connected to the analog input Q-signal and the opposite end connected to the negative terminal of a second operational amplifier 162. The negative terminal of the second operational amplifier 162 is connected to one end of a fifth resistor ($R_5$) 164. The opposite end of the fifth resistor 164 is connected to the output of the operational amplifier 162. The output of the operational amplifier 162 is fed to the second Schmitt trigger 166 and then input one end of a sixth resistor ($R_6$) 168. The opposite end of the sixth resistor 168 provides a digital Q-output signal as the output of the second ADC 104.

The positive terminals of the first 152 and second 162 operational amplifiers are fed by a voltage divider having a reference voltage ($V_{ref}$) 170, a seventh resistor ($R_7$) 172, and an eighth resistor ($R_8$) 174. The eighth resistor 174 is connected at one end to ground, i.e., 0 volts. The other end of the eighth resistor is connected, in parallel, to one end of the seventh resistor 172 and to the positive terminals of the first 152 and second 162 operational amplifiers. The other end of the seventh resistor 172 is connected to the positive terminal of the reference voltage 170.

In the present embodiment, $R_1=R_4=100$ kΩ, $R_2=R_5=490$ kΩ, $R_3=R_5=10$ kΩ, $R_7=33$ kΩ, and $R_8=10$ kΩ. The first 152 and second 162 operational amplifiers are ½ LM258 operational amplifiers. The first 156 and second 166 Schmitt triggers are ⅙ 74ACT14 Schmitt triggers. The J-K flip-flops 106 and 108, are implemented with a SN74LS73AN edge triggered flip-flop module.

By analyzing the transfer characteristics of the first 102 and second 104 ADCs, those skilled in the art will appreciate that the ADCs 102 and 104 are comparator circuits with high and low threshold voltages. Hysteresis characteristics, i.e., the difference between the high and low threshold voltages of the ADCs 102 and 104 are designed to limit the effects of noise on the output of the ADCs 102 and 104.

When the input waveform, i.e., the analog I-input and/or the analog Q-input voltages reach the high voltage threshold, the output of the ADC 102 and/or 104 transitions to a high state. When the input waveform reaches the low voltage threshold, the output of the ADC 102 and/or 104 transitions to a low state.

Those skilled in the art will appreciate that the high and low threshold voltages may be equal without departing from the scope of the present invention. Also, the resistors R1 though R8 may be replaced with circuit elements having different impedences. In addition, the ADCs 102 and/or 104 may be implemented with another type of circuit without departing from the scope of the present invention.

For telecommunications applications employing FM (frequency modulation) modulation, the gating times of the up-counter 110 and down-counter 112 place restraints on the bit size of the counters 110 and 112. In the present specific embodiment, the counters 110 and 112 are 16-bit counters.

For a carrier frequency of 300 Hz, adequate voice accommodation requires that the system 100 has a gating period larger than approximately 10 milliseconds. The gating period for the system 100 is chosen to be approximately 40 milliseconds.

The maximum number signal of cycles $N_{max}$, i.e., the maximum number of cycles of the analog and/or digital I and/or Q signals within a time interval $T_{gate}$, where $T_{gate}$ is the gating period of the system 100 is:

$$N_{max}=T_{gate}\times 2\pi(\Delta F)(1+\pi/2(\text{Offest})) \quad [1]$$

Where Offset is the fixed DC frequency offset of the carrier wave and ((Offset)$^2$<<1); ΔF is the peak FM deviation of the carrier wave. The frequency resolution of the system 100 is $2/T_{gate}$. Methods for achieving the appropriate gating period are well known in the art.

Equation [1] may then be used to verify the applicability of the particular implementation to a particular application. Using equation [1], for example, and assuming, for a particular application $T_{gate}=0.04$ seconds, ΔF=10,000 Hz, Offset=5,000 Hz, then $N_{max}=4487$ cycles. The counters 110 and 112 are 16-bit counters and therefore have maximum counts of 64,000. Thus the counters 110 and 112 can easily handle 4487 cycles and are sufficient for the particular application.

Figure 7:
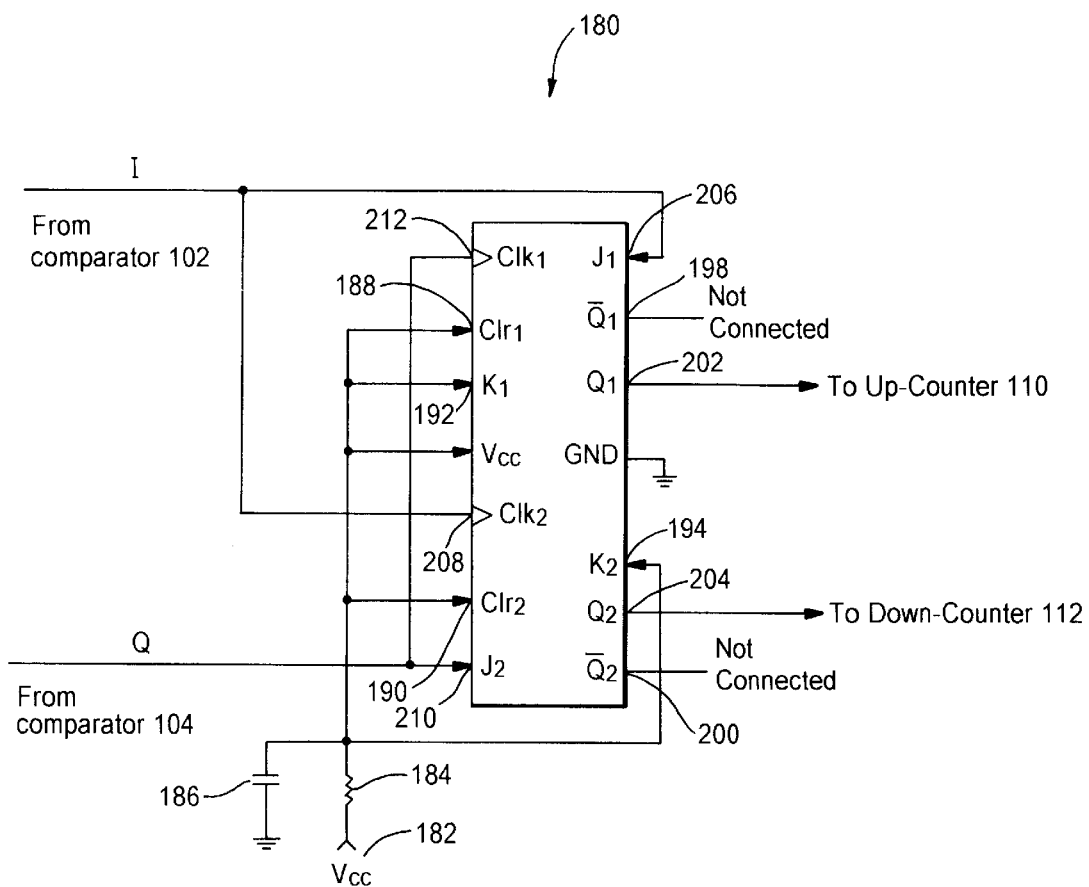
FIG. 7 is a diagram of a J-K flip-flop module adapted for use with the system of FIG. 5.

FIG. 7 is a diagram of a SN74LS73AN J-K flip flop module 180 adapted for use with the system 100 of FIG. 5. The module 180 implements the J-K flip-flops 106 and 108 of FIG. 5. A high voltage source ($V_{cc}$) is input to one end of a resistor 184, the opposite end of which is connected, in parallel to one end of a capacitor 186 the other end of which is connected to ground, first 188 and second clear-inputs 190 ($Clr_1$ and $Clr_2$) and first 192 and second 194 K-inputs ($K_1$ and $K_2$), and a module voltage input 196 ($V_{cc}$). A first complimentary output ($\overline{Q_1}$) 198 and a second complimentary output ($\overline{Q_2}$) 200 are left unconnected. A first output ($Q_1$) 202 is input to the up-counter 110 of FIG. 5 and a second output ($Q_2$) is input to the down-counter 112 of FIG. 5. The analog I-signal is input, in parallel, to a first J-input ($J_1$) 206 and a second clock input ($Clk_2$) 208. The analog Q-signal is input, in parallel, to a second J-input ($J_2$) 210 and a first clock input ($Clk_1$) 212.

In the present embodiment, the capacitance of the capacitor 186 is approximately 0.01 micro Farads and the resistance of the resistor 184 is approximately 50 Ohms. The capacitor 186 helps to remove any alternating current (AC) component of the high voltage 182. The resistor 184 is optional.

Thus, the present invention has been described herein with reference to a particular embodiment for a particular application. Those having ordinary skill in the art and access to the present teachings will recognize additional modifications, applications and embodiments within the scope thereof It is therefore intended by the appended claims to cover any and all such applications, modifications and embodiments within the scope of the present invention.

Accordingly,

What is claimed is:

1. A system for extracting and compensating for reference frequency error in a communications system comprising:

frequency generation means for outputting a reference signal of a first frequency, said frequency generation means having a control signal input for adjusting said first frequency in response to a control signal;

receive means for receiving an input signal and providing an output signal having a first and second component in response thereto; and error extraction means for providing an error value based on a phase difference between said first component and said second component wherein said error extraction means includes a positive error counting means for generating a positive count when said first component lags said second component and a negative error counting means for generating a negative count when said first component leads said second component, said control signal having a magnitude based upon the difference between said positive count and said negative count.

2. The invention of claim 1 wherein said frequency generation means includes a voltage controlled oscillator.

3. The invention of claim 2 wherein said frequency generation means includes a temperature-compensated voltage-controlled crystal oscillator.

4. The invention of claim 1 wherein said receive means includes a telecommunications receiver.

5. The invention of claim 4 wherein said telecommunications receiver includes a demodulator.

6. The invention of claim 5 wherein said demodulator is a vector demodulator.

7. The invention of claim 5 wherein said demodulator produces in-phase and quadrature signals from said input signal, said in-phase and quadrature signals corresponding to said first and second signal components, respectively.

8. The invention of claim 1 wherein said positive error counting means includes a positive error detecting circuit coupled to an up-counter and wherein said negative error counting means includes a negative error detecting circuit coupled to a down-counter.

9. The invention of claim 8 wherein said error extraction means further includes a subtractor coupled to said up-counter and to said down-counter.

10. The invention of claim 9 wherein said error extraction means further includes an accumulation means for providing a difference of said positive count and said negative counts.

11. The invention of claim 10 wherein said accumulation means includes an up-counter having an input connected to a Q-output of said first J-K flip-flop, and a down-counter having an input connected to a Q-output of said second J-K flip-flop.

12. The invention of claim 11 wherein said accumulation means further includes a subtractor having an input connected, in parallel, to the output of said up-counter and the output of said down-counter.

13. The invention of claim 10 wherein said accumulation means includes a frequency error control means for generating said control signal from said difference of said positive count and said negative count, said control signal dependent on parameters of said frequency generation means.

14. The invention of claim 1 wherein said error extraction means includes means for shaping said first component and said second component so that said first component and said second component are suitable to drive a digital circuit.

15. The invention of claim 1 wherein said system has a gating period of greater than 10 milliseconds.

16. A system for extracting and compensating for reference frequency error in a communications system comprising:

frequency generation means for outputting a reference signal of a first frequency, said frequency generation means having a control signal input for adjusting said first frequency in response to a control signal;

receive means for receiving an input signal and providing an output signal having a first and second component in response thereto; and error extraction means for providing an error value based on a phase difference between said first component and said second component and for providing said control signal in response thereto, said error extraction means including positive error counting means for generating a positive count when said first component lags said second component and negative error counting for generating a negative count when said first component leads said second component wherein said positive error counting means and said negative error counting means include first and second J-K flip-flops, respectively.

17. The invention of claim 16 wherein a J-input of said second J-K flip-flop is connected in parallel to a clock input of said first flip-flop, and a J-input of said first J-K flip-flop is connected to a clock input of said second J-K flip-flop.

18. The invention of claim 17 wherein a K-input of said first J-K flip-flop and a K-input of said second J-K flip-flop are connected to a high voltage source.

19. A system for extracting and compensating for reference frequency error in a communications system comprising:

frequency generation means for outputting a reference signal of a first frequency, said frequency generation means having a control signal input for adjusting said first frequency in response to a control signal;

receive means for receiving an input signal and providing an output signal having a first and second component in response thereto; and error extraction means for providing an error value based on a phase difference between said first component and said second component, and providing said control signal in response thereto wherein said error extraction means includes means for shaping said first component and said second component so that said first component and said second component are suitable to drive a digital circuit, said means for shaping including a bistable circuit for comparing said first component and/or said second component to a predetermined threshold and for providing a digital signal in response thereto.

20. The invention of claim 19 wherein said bistable circuit is a comparator circuit having an operational amplifier.

21. The invention of claim 20 wherein said operational amplifier is a ½ LM258 operational amplifier.

22. The invention of claim 19 wherein said bistable circuit is a Schmitt trigger.

23. The invention of claim 22 wherein said Schmitt trigger is a ⅙ 74ACT14 amplifier.

24. The invention of claim 19 wherein said digital circuit includes a J-K flip-flop.

25. A system for extracting and compensating for reference frequency error in a communications system comprising:

frequency generation means for outputting a reference signal of a first frequency, said frequency generation means having a control signal input for adjusting said first frequency in response to a control signal;

receive means for receiving an input signal and providing an output signal having a first and second component in response thereto wherein said input signal is a frequency modulated signal and said system has a cycle count less than $$T_{gate} \times 2\pi(\Delta F)(1+\pi/2)(\text{Offset})),$$

where Offset is the fixed direct current frequency offset of a frequency modulation carrier wave and $((\text{Offset})^2 \ll 1)$, $\Delta F$ is the peak FM deviation of the carrier wave, and $T_{gate}$ is the gating period of said system; and error extraction means for providing an error value based on a phase difference between said first component and said second component, and providing said control signal in response thereto.

26. A system for extracting and compensating for reference frequency error in a communications system comprising the steps of:

a reference frequency source for outputting a reference signal of a first frequency, said frequency source having a control input for adjusting said first frequency in response to a control signal;

a receive circuit for receiving an input signal and outputting a processed signal in response thereto, said processed signal having a first component and a second component;

positive counter for providing a positive count when said first component lags said second component;

negative counter for providing a negative count when said first component leads said second component; and an error controller for generating said control signal having a magnitude based on the difference between said positive count and said negative count.

27. A receiver for use in a communications system comprising:

first means for receiving an input signal and providing an output signal having first and second components in response thereto;

second means for outputting a reference signal of a first frequency, said second means having a control input for adjusting said first frequency in response to a control signal; and a counter circuit for providing an error value based on a phase difference between said first component and said second component; and controller means for providing said control signal in response to said error value wherein said control signal is generated on the basis of a magnitude of said error value.

28. A demodulator for use in a communications system comprising:

first means for receiving an input signal of a first frequency;

second means for outputting a reference signal of a first frequency, said second means having a control input for adjusting said first frequency in response to a control signal;

mixing means for mixing said input signal to a demodulated signal of a second frequency in response to said reference signal, said demodulated signal having a first and second component;

a counter circuit for providing an error value based on a phase difference between said first component and said second component; and means for providing said control signal in response to said error value wherein said control signal is generated on the basis of a magnitude of said error value.

29. A method for extracting and compensating for reference frequency error in a communications system comprising the steps of:

outputting a reference signal of a first frequency via a frequency source, said frequency source having a control input for adjusting said first frequency in response to a control signal;

receiving an input signal and providing an output signal having a first and second components in response thereto;

providing an error value based on a phase difference between said first component and said second component determined by a counter circuit, said error circuit including a positive counter for providing a positive count when said first component lags said second component and a negative counter for providing a negative count when said first component leads said second component; and providing said control signal having a magnitude in response wherein said control signal is generated on the basis of a magnitude of said error value.

30. A system for extracting and compensating for reference frequency error in a communications system comprising:

frequency generation means for outputting a reference signal of a first frequency, said frequency generation means having a control signal input for adjusting said first frequency in response to a control signal;

receive means for receiving an input signal and providing an output signal having a first and second component in response thereto; and a counter circuit for providing an error value based on a phase difference between said first component and said second component; and a controller for providing said control signal in response to said error value, said control signal being generated on the basis of a magnitude of said error value.

* * * * *